(12) United States Patent
Hung

(10) Patent No.: US 11,385,275 B2
(45) Date of Patent: Jul. 12, 2022

(54) HIGH-PRESSURE BURN-IN TEST APPARATUS

(71) Applicant: Yi-Ming Hung, Miaoli County (TW)

(72) Inventor: Yi-Ming Hung, Miaoli County (TW)

( * ) Notice: Subject to any disclaimer, the term of this patent is extended or adjusted under 35 U.S.C. 154(b) by 0 days.

(21) Appl. No.: 17/237,067

(22) Filed: Apr. 22, 2021

(65) Prior Publication Data

US 2021/0356506 A1 Nov. 18, 2021

(30) Foreign Application Priority Data

May 15, 2020 (TW) ................................. 109116500

(51) Int. Cl.
*G01R 31/00* (2006.01)
*G01R 31/28* (2006.01)

(52) U.S. Cl.
CPC ....... *G01R 31/003* (2013.01); *G01R 31/2849* (2013.01)

(58) Field of Classification Search
None
See application file for complete search history.

(56) References Cited

U.S. PATENT DOCUMENTS 8,616,194 B2 * 12/2013 Sherrow ................ F24H 3/087
126/110 A
2020/0182479 A1 * 6/2020 Hung ..................... F24C 7/081

FOREIGN PATENT DOCUMENTS

WO WO-2016107469 A1 * 7/2016 .............. F02B 33/34

* cited by examiner

*Primary Examiner* — Jermele M Hollington

(57) ABSTRACT

A high-pressure burn-in test apparatus comprises a burn-in furnace including a high-pressure burn-in furnace cavity equipped with a driving motor, at least one intake manifold, at least one extension manifold equipped with a nozzle, a communicating tube connected to the intake manifold, and a fan. A processing chamber having a test board is formed inside the high-pressure burn-in furnace cavity. The periphery of at least one of the intake manifold is connected to the at least one extension manifold. At least one component to be tested is placed on the test board. High-pressure gas is ejected through the nozzle to disturb the gas around the component to be tested. The fan is installed in the processing chamber. The driving motor drives the fan to rotate, so that the gas in the processing chamber generates convection, to improve the uniformity of gas temperature distribution.

16 Claims, 3 Drawing Sheets

HIGH-PRESSURE BURN-IN TEST APPARATUS

CROSS REFERENCE TO RELATED APPLICATIONS

The present application claims the benefit of Taiwanese Patent Application No. 109116500 filed on May 15, 2020, the contents of which are incorporated herein by reference in their entirety.

BACKGROUND OF THE INVENTION

1. Field of the Invention

The present invention relates to the technical field of electronic packaging, and in particular, technically provides a high-pressure burn-in test apparatus in which high-pressure gas is respectively ejected from nozzles to disturb the gas around a component to be tested; a fan is driven to rotate by using a motor shaft, so that the high-pressure gas in a processing chamber generates convection; and a flow rate of gas flowing into the processing chamber is adjusted through a circulating device, to effectively improve the temperature adjustment efficiency, and fully achieve the effect of improving the uniformity of gas temperature distribution.

2. Description of the Related Art

In a manufacturing process of electronic components (such as IC components), after the electronic components are manufactured, the electronic components are usually subjected to a burn-in test to test the reliability of the electronic components. The burn-in test is to place the electronic components in a burn-in test machine for heating, and also conduct an electric test on the electronic components to test whether the reliability of the electronic components meets a standard.

Referring to FIG. 5, in a conventional open burn-in test device, a burn-in test board 1 is provided thereon with a plurality of burn-in test bases 2 that can hold electronic components for a burn-in test, each burn-in test base 2 is provided with a heater (not shown) configured to heat the electronic component held thereon, and each burn-in test base 2 is provided thereon with a fan 3 configured to continuously extract hot air from the burn-in test base 2, to avoid damage to the burn-in test board 1, the burn-in test base 2 and the electronic component to be tested (not shown) due to heat accumulation thereon. In addition, a fan (not shown) is further provided in the conventional open burn-in test device to continuously draw the air outside the open burn-in test device into the open burn-in test device (or a burn-in test furnace) from an air inlet end 4, and the air is discharged from an air outlet end 5 after flowing through components such as the burn-in test board 1, the burn-in test base 2 and the electronic component to be tested, and the hot air extracted by the fan 3 from the burn-in test base 2 is also taken away for circulation with the outside air to achieve the effects of heat dissipation and cooling. Although the above-mentioned cooling and heat dissipation system can perform heat dissipation and cooling on the open burn-in test device (or the burn-in test furnace), since the contacted air closer to the air inlet end 4 is the air that has just entered from the external environment, the temperature of the air here is lower, resulting in that the closer the air in the burn-in test furnace is to the air inlet end 4, the lower the temperature is. However, the contacted air closer to the air outlet end 5 is the air that has been heated by the components such as the burn-in test board 1; therefore, compared with the temperature of the air at the air inlet end 4, the temperature of the air here (i.e., at the air outlet end 5) is higher, resulting in that the closer the air in the burn-in test furnace is to the air outlet end 5, the higher the temperature is. Such a temperature difference results in non-uniform temperature in the burn-in test furnace, and therefore causes turbulence in the burn-in test furnace, which makes the hot air in the burn-in test furnace not easy to be discharged, resulting in heat accumulation. The non-uniformity of heat dissipation (temperature) causes the components in the burn-in test device (such as a burn-in test control component, the burn-in test board, and the burn-in test bases) to be prone to damage due to heat accumulation after a long period of use. In addition, since the continuously contacted air close to the air inlet end 4 is always the air of lower temperature, the electronic components to be tested closer to the air inlet end 4 are less likely to be heated, and the power of the heaters in the burn-in test bases 2 in this area needs to be increased to reach a preset test temperature, resulting in a high test cost. There is really a need for improvement.

Hence, in view of the problems of heat accumulation and non-uniform heat dissipation in the above-mentioned conventional electronic components during a burn-in test, how to develop a burn-in test apparatus that is more ideally practical and economical is the goal and direction for the relevant industry to make a breakthrough in research and development actively.

In view of this, based on many years of experience in the manufacturing, development and design of related products, the inventor has made detailed design and careful evaluation for the above-mentioned goal, and has finally come up with the present invention that is truly practical.

SUMMARY OF THE INVENTION

Technical problem to be solved: during a burn-in test of conventional electronic components, the non-uniformity of heat dissipation (temperature) may cause components in a burn-in test device to be easily damaged due to heat accumulation after a long period of use. In addition, since the continuously contacted air close to an air inlet end is always the air of lower temperature, electronic components to be tested closer to the air inlet end are less likely to be heated, and the power of heaters in burn-in test bases in this area needs to be increased to reach a preset test temperature, resulting in a high test cost. There is really a need for improvement.

Technical features for solving the problem: to ameliorate the above-mentioned problem, a first embodiment of the present invention provides a high-pressure burn-in test apparatus, including: a burn-in furnace including a high-pressure burn-in furnace cavity, at least one first intake manifold, at least one second intake manifold, at least one first extension manifold, at least one second extension manifold, a communicating tube, and a fan, wherein a processing chamber is formed inside the high-pressure burn-in furnace cavity, one side of the processing chamber is equipped with the at least one first intake manifold and the other side is equipped with the at least one second intake manifold, the communicating tube is connected to the at least one first intake manifold and the at least one second intake manifold, the periphery of the at least one first intake manifold is connected to the at least one first extension manifold, the periphery of the at least one second intake manifold is connected to the at least one second extension manifold, the at least one first intake manifold and the at least one second intake manifold are communicated with the communicating tube and the interiors of the at least one first extension manifold and the at least one second extension manifold, at least one test board is provided in the processing chamber, at least one component to be tested is placed on the test board, the component to be tested may be an electronic component to be tested, one end of the first extension manifold is equipped with a first nozzle, one end of the second extension manifold is equipped with a second nozzle, high-pressure gas in the at least one first extension manifold and the at least one second extension manifold is respectively ejected through the at least one first nozzle and the at least one second nozzle to disturb the gas around each component to be tested, to achieve the effect of quickly cooling or heating each component to be tested, thereby effectively improving the temperature adjustment efficiency, the high-pressure burn-in furnace cavity is equipped with a driving motor, the fan is installed in the processing chamber, and when the driving motor rotates, the fan is driven to rotate so that the gas in the processing chamber generates convection to promote temperature adjustment in the processing chamber, thereby effectively improving the uniformity of gas temperature distribution;

a gas conveying unit including a gas input pipe, a gas discharge pipe, and a gas communication pipe, wherein the gas input pipe inputs the gas into the processing chamber, the gas discharge pipe discharges the gas out of the processing chamber, and a gas circulation path is formed by the gas communication pipe, the gas input pipe, and the gas discharge pipe;

a circulating device connected to the high-pressure burn-in furnace cavity through the gas discharge pipe and also connected to the gas input pipe through the gas communication pipe, wherein the gas in the processing chamber is sucked out and a flow rate of gas flowing into the gas circulation pipe is adjusted by the circulating device, the flow rate of the gas may be adjusted according to the temperature on or near the surface of the component to be tested, and the circulating device is a fan with adjustable speed;

a cooler disposed on the gas input pipe or the gas discharge pipe, wherein the gas flowing into the processing chamber is cooled by the cooler;

a heater disposed on the gas input pipe or the gas discharge pipe, wherein the gas flowing into the processing chamber is heated by the heater; and a pressure varying device connected to the high-pressure burn-in furnace cavity through the gas inlet pipe, wherein the flow rate of the gas flowing into the processing chamber is adjusted by means of a change in pressure level of the pressure varying device, so that the gas density in the processing chamber in a high-pressure working environment can be changed by adjusting the flow rate of the gas, and the cooling and heating efficiency of the component to be tested can be improved by increasing the gas density (greater than one atmosphere), to achieve the effects of quick cooling and quick heating. In addition, the heat capacity can also be increased by increasing the gas density in the processing chamber, which helps to improve the uniformity of the gas temperature distribution.

As described above, to meet the requirements of a cooling or heating process, the at least one first nozzle and the at least one second nozzle are respectively disposed on one end of the at least one first extension manifold and one end of the second extension manifold to adjust the ejection direction of the high-pressure gas.

As described above, the high-pressure gas in the at least one first extension manifold and the at least one second extension manifold is respectively accelerated and ejected through the at least one first nozzle and the at least one second nozzle, to disturb the gas in the processing chamber in cooperation with the fan, so that the gas around each component to be tested and the gas in the processing chamber are fully mixed to quickly reach heat balance, which helps to improve the uniformity of the gas temperature distribution. In addition, since gas molecules in the processing chamber are far more than those around each component to be tested, the temperature of each component to be tested can be quickly adjusted to achieve the effect of quickly cooling or heating each component to be tested.

A second embodiment of the present invention provides a high-pressure burn-in test apparatus, including: a burn-in furnace including a high-pressure burn-in furnace cavity, at least one intake manifold, at least one extension manifold, a communicating tube, and a fan, wherein a processing chamber is formed inside the high-pressure burn-in furnace cavity, one side of the processing chamber is equipped with the at least one intake manifold, the communicating tube is connected to the at least one intake manifold, the periphery of the at least one intake manifold is connected to the at least one extension manifold, the interiors of the at least one intake manifold, the communicating tube and the at least one extension manifold are communicated with each other, at least one test board is provided in the processing chamber, a component to be tested is placed on the test board, the component to be tested may be an electronic component to be tested, one end of the extension manifold is equipped with a nozzle, high-pressure gas in at least one extension manifold is ejected through the at least one nozzle to disturb the gas around each component to be tested, to achieve the effect of quickly cooling or heating each component to be tested, thereby effectively improving the temperature adjustment efficiency, the high-pressure burn-in furnace cavity is equipped with a driving motor, the fan is installed in the processing chamber, and when the driving motor rotates, the fan is driven to rotate so that the gas in the processing chamber can generate convection to promote temperature adjustment in the processing chamber, thereby effectively improving the uniformity of gas temperature distribution;

a gas conveying unit including a gas input pipe, a gas discharge pipe, and a gas communication pipe, wherein the gas input pipe inputs the gas into the processing chamber, the gas discharge pipe discharges the gas out of the processing chamber, and a gas circulation path is formed by the gas communication pipe, the gas input pipe, and the gas discharge pipe;

a circulating device connected to the high-pressure burn-in furnace cavity through the gas discharge pipe and also connected to the gas input pipe through the gas communication pipe, wherein the gas in the processing chamber is sucked out and a flow rate of gas flowing into the gas circulation pipe is adjusted by the circulating device, the flow rate of the gas may be adjusted according to the temperature on or near the surface of the component to be tested, and the circulating device is a fan with adjustable speed;

a cooler disposed on the gas input pipe or the gas discharge pipe, wherein the gas flowing into the processing chamber is cooled by the cooler;

a heater disposed on the gas input pipe or the gas discharge pipe, wherein the gas flowing into the processing chamber is heated by the heater; and a pressure varying device connected to the high-pressure burn-in furnace cavity through the gas input pipe, wherein the flow rate of the gas flowing into the processing chamber is adjusted by means of a change in pressure level of the pressure varying device, so that the gas density in the processing chamber in a high-pressure working environment can be changed by adjusting the flow rate of the gas, and the cooling and heating efficiency can be improved by increasing the gas density (greater than one atmosphere). In addition, the heat capacity can also be increased by increasing the gas density in the processing chamber, which helps to improve the uniformity of the gas temperature distribution.

As described above, to meet the requirements of a cooling or heating process, the at least one nozzle is disposed on one end of the at least one extension manifold to adjust the ejection direction of the high-pressure gas.

As described above, the high-pressure gas in the at least one extension manifold is accelerated and ejected through the at least one nozzle, to disturb the gas in the processing chamber in cooperation with the fan, so that the gas around each component to be tested and the gas in the processing chamber are fully mixed to quickly reach heat balance, which helps to improve the uniformity of the gas temperature distribution. In addition, since gas molecules in the processing chamber are far more than those around each component to be tested, the temperature of each component to be tested can be quickly adjusted, thereby achieving the effect of quickly cooling or heating each component to be tested.

Compared with the effects of the prior art: according to the high-pressure burn-in test apparatus of the present invention, the high-pressure gas in the first and second extension manifolds is respectively ejected through the first and second nozzles that can adjust the ejection direction of the high-pressure gas, to disturb the gas around the components to be tested to achieve the effect of quickly cooling or heating each component to be tested, thereby effectively improving the temperature adjustment efficiency; the fan is driven to rotate by using a motor shaft, so that the gas in the processing chamber generates convection to promote temperature adjustment in the processing chamber, thereby effectively improving the uniformity of gas temperature distribution; and the flow rate of the gas flowing into the processing chamber through the gas input pipe is adjusted by means of a change in pressure level of the pressure varying device, so that the gas density in the processing chamber in a high-pressure working environment can be changed by adjusting the flow rate of the gas, thereby achieving the effect of improving the uniformity of the gas temperature distribution.

The techniques and means adopted by the present invention and the effects thereof are described in detail by giving a number of preferred embodiments in conjunction with the drawings. It is believed that the above-mentioned objective, structure and features of the present invention can thus be understood thoroughly and concretely.

DESCRIPTION OF REFERENCE NUMERALS

Figure 1:
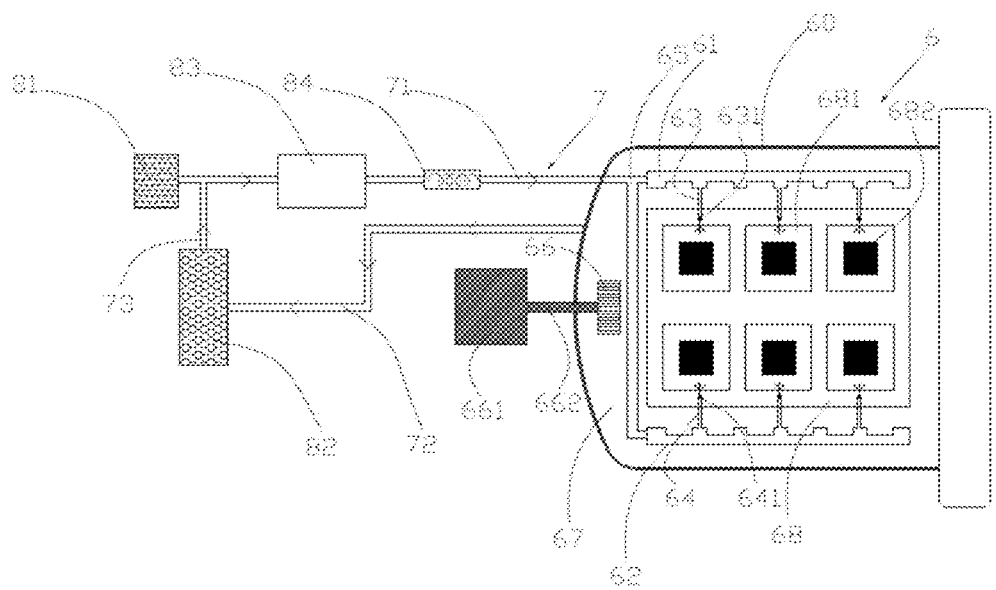
FIG. 1 is a schematic top-view of a high-pressure burn-in test apparatus according to a first embodiment of the present invention.

1: Burn-in test board
2: Burn-in test base
3: Fan
4: Air inlet end
5: Air outlet end
6: Burn-in furnace
60: High-pressure burn-in furnace cavity
61: First intake manifold
61*a*: Intake manifold
62: Second intake manifold
63: First extension manifold
63*a*: Extension manifold
631: First nozzle
631*a*: Nozzle
64: Second extension manifold
641: Second nozzle
65: Communicating tube
65*a*: Communicating tube
66: Fan
661: Driving motor
662: Motor shaft
67: Processing chamber
68: Processing frame
681: Test board
682: Component to be tested
7: Gas conveying unit
71: Gas input pipe
72: Gas discharge pipe
73: Gas communication pipe
81: Pressure varying device
82: Circulating device
83: Cooler
84: Heater

DETAILED DESCRIPTION OF THE PREFERRED EMBODIMENTS

Figure 2:
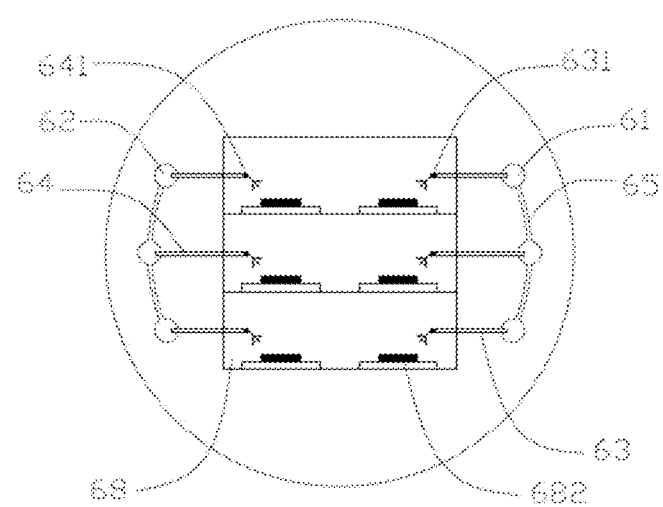
FIG. 2 is a schematic front view of the high-pressure burn-in test apparatus according to the first embodiment of the present invention.

Referring to FIG. 1 and FIG. 2, a first embodiment of the present invention provides a high-pressure burn-in test apparatus, including: a burn-in furnace 6. The burn-in furnace 6 includes a high-pressure burn-in furnace cavity 60, at least one first intake manifold 61, at least one second intake manifold 62, at least one first extension manifold 63, at least one second extension manifold 64, a communicating tube 65, and a fan 66. A processing chamber 67 is formed inside the high-pressure burn-in furnace cavity 60. One side of the processing chamber 67 is equipped with the at least one first intake manifold 61, and the other side is equipped with the at least one second intake manifold 62. The communicating tube 65 is connected to the at least one first intake manifold 61 and the at least one second intake manifold 62. The periphery of the at least one first intake manifold 61 is connected to the at least one first extension manifold 63. The periphery of the at least one second intake manifold 62 is connected to the at least one second extension manifold 64. The at least one first intake manifold 61 and the at least one second intake manifold 62 are communicated with the communicating tube 65 and the interiors of the at least one first extension manifold 63 and the at least one second extension manifold 64. A processing frame 68 is provided in the processing chamber 67 between the at least one first intake manifold 61 and the at least one second intake manifold 62. The processing frame 68 is provided with at least one test board 681. At least one component to be tested 682 is placed on the test board 681. The component to be tested 682 may be an electronic component to be tested. One end of the first extension manifold 63 is equipped with a first nozzle 631. One end of the second extension manifold 64 is equipped with a second nozzle 641. High-pressure gas in the at least one first extension manifold 63 and the at least one second extension manifold 64 is respectively ejected toward each component to be tested 682 through the at least one first nozzle 631 and the at least one second nozzle 641 to disturb the gas around each component to be tested 682, to achieve the effect of quickly cooling or heating each component to be tested 682, thereby effectively improving the temperature adjustment efficiency and improving the uniformity of gas temperature distribution. The high-pressure burn-in furnace cavity 60 is equipped with a driving motor 661. The fan 66 is installed in the processing chamber 67. The driving motor 661 is connected to the fan 66 through a motor shaft 662. When the driving motor 661 rotates, the fan 66 is driven to rotate by using the motor shaft 662, so that the gas in the processing chamber 67 can generate convection to promote temperature adjustment in the processing chamber 67 by means of the higher gas density of the high-pressure gas in combination with a heat convection effect, thereby effectively improving the uniformity of the gas temperature distribution.

The high-pressure burn-in test apparatus further includes a gas conveying unit 7. The gas conveying unit 7 includes a gas input pipe 71, a gas discharge pipe 72, and a gas communication pipe 73. The gas input pipe 71 inputs the gas into the processing chamber 67. The gas discharge pipe 72 discharges the gas out of the processing chamber 67. A gas circulation path is formed by the gas communication pipe 73, the gas input pipe 71, and the gas discharge pipe 72.

The high-pressure burn-in test apparatus further includes a pressure varying device 81. The pressure varying device 81 is connected to the high-pressure burn-in furnace cavity 60 through the gas input pipe 71. The pressure varying device 81 includes a pressure control unit (not shown) and a circulating ventilation unit (not shown). The pressure control unit and the circulating ventilation unit are electrically connected. A flow rate of gas flowing into the processing chamber 67 through the gas input pipe 71 is adjusted by means of a change in pressure level of the pressure varying device 81. Working pressure of the pressure varying device 81 ranges from 2 atmospheres (atm) to 50 atmospheres (atm). In addition, since the processing chamber 67 is a fixed space, the gas density in the processing chamber 67 can be changed by adjusting the flow rate of the gas, and the cooling and heating efficiency can be improved by increasing the gas density (greater than one atmosphere). The principle is that each gas molecule is a heat transfer carrier, and the heat-conducting capability of each type of gas is also definite. If the number of gas molecules can be increased in unit time, a temperature drop rate of the component to be tested 682 can be increased or a temperature rise rate of the component to be tested 682 can be increased in unit time. That is, the temperature adjustment efficiency is improved by increasing the number of the gas molecules, so as to achieve the effects of quick cooling and quick heating. In addition, the heat capacity can also be increased by increasing the gas density in the processing chamber 67, which helps to improve the uniformity of the gas temperature distribution.

The high-pressure burn-in test apparatus further includes a circulating device 82. The circulating device 82 is connected to the high-pressure burn-in furnace cavity 60 through the gas discharge pipe 72 and also connected to the gas input pipe 71 through the gas communication pipe 73. The gas in the processing chamber 67 is sucked out and a flow rate of gas flowing into the gas circulation pipe 73 is adjusted by the circulating device 82. The flow rate of the gas may be adjusted according to the temperature on or near the surface of the component to be tested 682. The circulating device 82 is a fan with adjustable speed.

The high-pressure burn-in test apparatus further includes a cooler 83. The cooler 83 is disposed on the gas input pipe 71 or the gas discharge pipe 72. The gas flowing into the processing chamber 67 through the gas input pipe 71 is cooled by the cooler 83.

The high-pressure burn-in test apparatus further includes a heater 84. The heater 84 is disposed on the gas input pipe 71 or the gas discharge pipe 72. The gas flowing into the processing chamber 67 is heated by the heater 84.

As described above, to meet the requirements of a cooling or heating process, the at least one first nozzle 631 and the at least one second nozzle 641 are respectively disposed on one end of the at least one first extension manifold 63 and one end of the second extension manifold 64 to adjust the ejection direction of the high-pressure gas. The first and second nozzles 631 and 641 adjust the ejection direction of the high-pressure gas according to a maximum heat-dissipation surface area of each component to be tested 682, so that the heat on the component to be tested 682 can be quickly taken away.

As described above, the high-pressure gas in the at least one first extension manifold 63 and the at least one second extension manifold 64 is respectively accelerated and ejected through the at least one first nozzle 631 and the at least one second nozzle 641, to disturb the gas in the processing chamber 67 in cooperation with the fan 66, so that the gas around each component to be tested 682 and the gas in the processing chamber 67 are fully mixed to quickly reach heat balance, which helps to improve the uniformity of the gas temperature distribution. In addition, because each gas molecule is a heat transfer carrier, the heat-conducting capability of each type of gas is also definite. Since gas molecules in the processing chamber 67 are far more than those around each component to be tested 682, the temperature of each component to be tested 682 can be quickly adjusted to achieve the effect of quickly cooling or heating each component to be tested 682.

Figure 3:
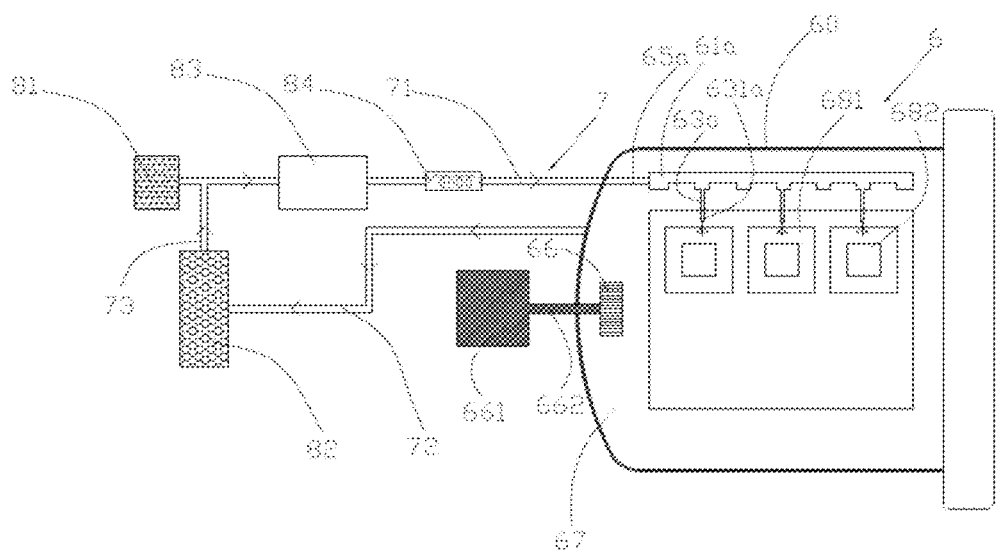
FIG. 3 is a schematic top-view of a high-pressure burn-in test apparatus according to a second embodiment of the present invention.
Figure 4:
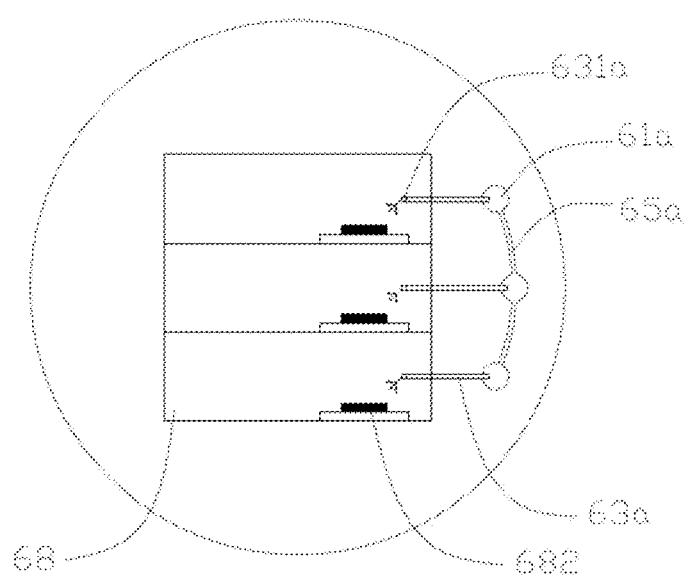
FIG. 4 is a schematic front view of the high-pressure burn-in test apparatus according to the second embodiment of the present invention.
Figure 5:
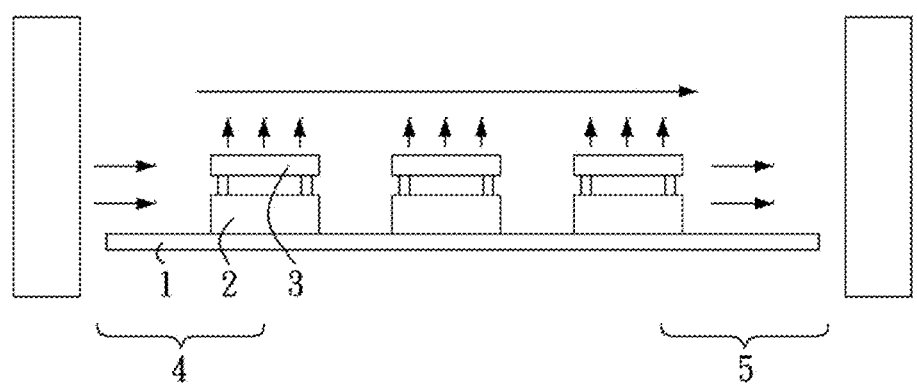
FIG. 5 is a schematic diagram of a conventional open burn-in test device.

Referring to FIG. 3 and FIG. 4 (where the same reference numerals are used for the same components as in the first embodiment), a second embodiment of the present invention provides a high-pressure burn-in test apparatus, including: a burn-in furnace 6. The burn-in furnace 6 includes a high-pressure burn-in furnace cavity 60, at least one intake manifold 61a, at least one extension manifold 63a, a communicating tube 65a, and a fan 66. A processing chamber 67 is formed inside the high-pressure burn-in furnace cavity 60. One side of the processing chamber 67 is equipped with the at least one intake manifold 61a. The communicating tube 65a is connected to the at least one intake manifold 61a. The periphery of the at least one intake manifold 61a is connected to the at least one extension manifold 63a. The interiors of the at least one intake manifold 61a, the communicating tube 65a and the at least one extension manifold 63a are communicated with each other. A processing frame 68 is provided in the processing chamber 67 beside the at least one intake manifold 61a. The processing frame 68 is provided with at least one test board 681. A component to be tested 682 is placed on the test board 681. The component to be tested 682 may be an electronic component to be tested. One end of the extension manifold 63a is equipped with a nozzle 631a. High-pressure gas in at least one extension manifold 63a is ejected through the at least one nozzle 631a towards each component to be tested 682 to disturb the gas around each component to be tested 682, to achieve the effect of quickly cooling or heating each component to be tested 682, thereby effectively improving the temperature adjustment efficiency and improving the uniformity of gas temperature distribution. The high-pressure burn-in furnace cavity 60 is equipped with a driving motor 661. The fan 66 is installed in the processing chamber 67. The driving motor 661 is connected to the fan 66 through a motor shaft 662. When the driving motor 661 rotates, the fan 66 is driven to rotate by using the motor shaft 662, so that the gas in the processing chamber 67 can generate convection to promote temperature adjustment in the processing chamber 67 by means of the higher gas density of the high-pressure gas in combination with a heat convection effect, thereby effectively improving the uniformity of the gas temperature distribution.

The high-pressure burn-in test apparatus further includes a gas conveying unit 7. The gas conveying unit 7 includes a gas input pipe 71, a gas discharge pipe 72, and a gas communication pipe 73. The gas input pipe 71 inputs the gas into the processing chamber 67. The gas discharge pipe 72 discharges the gas out of the processing chamber 67. A gas circulation path is formed by the gas communication pipe 73, the gas input pipe 71, and the gas discharge pipe 72.

The high-pressure burn-in test apparatus further includes a circulating device 82. The circulating device 82 is connected to the high-pressure burn-in furnace cavity 60 through the gas discharge pipe 72 and also connected to the gas input pipe 71 through the gas communication pipe 73. The gas in the processing chamber 67 is sucked out and a flow rate of gas flowing into the gas circulation pipe 73 is adjusted by the circulating device 82. The flow rate of the gas may be adjusted according to the temperature on or near the surface of the component to be tested 682. The circulating device 82 is a fan with adjustable speed.

The high-pressure burn-in test apparatus further includes a cooler 83. The cooler 83 is disposed on the gas input pipe 71 or the gas discharge pipe 72. The gas flowing into the processing chamber 67 is cooled by the cooler 83.

The high-pressure burn-in test apparatus further includes a heater 84. The heater 84 is disposed on the gas input pipe 71 or the gas discharge pipe 72. The gas flowing into the processing chamber 67 is heated by the heater 84.

As described above, to meet the requirements of a cooling or heating process, the at least one nozzle 631a is disposed on one end of the at least one extension manifold 63a to adjust the ejection direction of the high-pressure gas. The nozzle 631a adjusts the ejection direction of the high-pressure gas according to a maximum heat-dissipation surface area of each component to be tested 682, so that the heat on the component to be tested 682 can be quickly taken away.

The high-pressure burn-in test apparatus further includes a pressure varying device 81. The pressure varying device 81 is connected to the high-pressure burn-in furnace cavity 60 through the gas input pipe 71. The pressure varying device 81 includes a pressure control unit (not shown) and a circulating ventilation unit (not shown). The pressure control unit and the circulating ventilation unit are electrically connected. The flow rate of the gas flowing into the processing chamber 67 through the gas input pipe 71 is adjusted by means of a change in pressure level of the pressure varying device 81. Working pressure of the pressure varying device 81 ranges from 2 atmospheres (atm) to 50 atmospheres (atm). In addition, since the processing chamber 67 is a fixed space, the gas density in the processing chamber 67 can also be changed by adjusting the flow rate of the gas, and the cooling and heating efficiency can be improved by increasing the gas density (greater than one atmosphere). In addition, the heat capacity can also be increased by increasing the gas density in the processing chamber 67, which helps to improve the uniformity of the gas temperature distribution.

As described above, the high-pressure gas in the at least one extension manifold 63a is accelerated and ejected through the at least one nozzle 631a, to disturb the gas in the processing chamber 67 in cooperation with the fan 66, so that the gas around each component to be tested 682 and the gas in the processing chamber 67 are fully mixed to quickly reach heat balance, which helps to improve the uniformity of the gas temperature distribution. In addition, because each gas molecule is a heat transfer carrier, the heat-conducting capability of each type of gas is also definite. Since gas molecules in the processing chamber 67 are far more than those around each component to be tested 682, the temperature of each component to be tested 682 can be quickly adjusted to achieve the effect of quickly cooling or heating each component to be tested 682.

In the high-pressure burn-in test apparatus of the present invention, the high-pressure burn-in furnace cavity 60 is further connected to a pressure source (not shown). Gas flows into the processing chamber 67 through the pressure source, so that the processing chamber 67 is maintained in an environment having a working pressure of 2 atmospheres (atm) to 50 atmospheres (atm).

In the high-pressure burn-in test apparatus of the present invention, the high-pressure gas in the at least one first extension manifold 63 and the at least one second extension manifold 64 is respectively ejected through the at least one first nozzle 631 and the at least one second nozzle 641 that can adjust the ejection direction of the high-pressure gas to disturb the gas around each component to be tested 682, to achieve the effect of quickly cooling or heating each component to be tested, thereby effectively improving the temperature adjustment efficiency.

In the high-pressure burn-in test apparatus of the present invention, the fan 66 is driven to rotate by using the motor shaft 662, so that the gas in the processing chamber 67 can generate convection to promote temperature adjustment in the processing chamber 67, thereby effectively improving the uniformity of the gas temperature distribution.

In the high-pressure burn-in test apparatus of the present invention, the processing chamber 67 of the high-pressure burn-in furnace cavity 60 is under a high-pressure working environment. The flow rate of the gas flowing into the processing chamber 67 through the gas input pipe 71 is adjusted by the circulating device 82. In addition, the gas density in the processing chamber 67 can be changed by adjusting the flow rate of the gas, thereby achieving the effect of improving the uniformity of the gas temperature distribution.

The foregoing is a detailed description of the technical features of the present invention for the preferred embodiments of the present invention. However, those familiar with the art can make changes and modifications to the present invention without departing from the spirit and principle of the present invention. Moreover, such changes and modifications shall be all fall within the scope defined by the following claims.

What is claimed is:

1. A high-pressure burn-in test apparatus, comprising:
a burn-in furnace comprising a high-pressure burn-in furnace cavity, at least one first intake manifold, at least one second intake manifold, at least one first extension manifold, at least one second extension manifold, a communicating tube, and a fan, wherein a processing chamber is formed inside the high-pressure burn-in furnace cavity, one side of the processing chamber is equipped with the at least one first intake manifold and the other side is equipped with the at least one second intake manifold, the communicating tube is connected to the at least one first intake manifold and the at least one second intake manifold, the periphery of the at least one first intake manifold is connected to the at least one first extension manifold, the periphery of the at least one second intake manifold is connected to the at least one second extension manifold, the at least one first intake manifold and the at least one second intake manifold are communicated with the communicating tube and the interiors of the at least one first extension manifold and the at least one second extension manifold, at least one test board is provided in the processing chamber, at least one component to be tested is placed on the test board, one end of the first extension manifold is equipped with a first nozzle, one end of the second extension manifold is equipped with a second nozzle, high-pressure gas in the at least one first extension manifold and the at least one second extension manifold is respectively ejected through the at least one first nozzle and the at least one second nozzle to disturb the gas around the component to be tested, the high-pressure burn-in furnace cavity is equipped with a driving motor, the fan is installed in the processing chamber, and when the driving motor rotates, the fan is driven to rotate so that the gas in the processing chamber generates convection;
a circulating device, wherein the gas in the processing chamber is sucked out and a flow rate of the gas is adjusted by the circulating device; and
a cooler, wherein the gas flowing into the processing chamber is cooled by the cooler.

2. The high-pressure burn-in test apparatus according to claim 1, wherein the at least one first nozzle and the at least one second nozzle are respectively disposed on one end of the at least one first extension manifold and one end of the second extension manifold to adjust the ejection direction of the high-pressure gas.

3. The high-pressure burn-in test apparatus according to claim 1, further comprising a pressure varying device, wherein the flow rate of the gas flowing into the processing chamber is adjusted by means of a change in pressure level of the pressure varying device.

4. The high-pressure burn-in test apparatus according to claim 2, further comprising a pressure varying device, wherein the flow rate of the gas flowing into the processing chamber is adjusted by means of a change in pressure level of the pressure varying device.

5. The high-pressure burn-in test apparatus according to claim 1, wherein working pressure in the processing chamber changes in a range from 2 atmospheres (atm) to 50 atmospheres (atm).

6. The high-pressure burn-in test apparatus according to claim 3, wherein working pressure in the pressure varying device changes in a range from 2 atmospheres (atm) to 50 atmospheres (atm).

7. The high-pressure burn-in test apparatus according to claim 1, further comprising a gas conveying unit, wherein the gas conveying unit comprises a gas input pipe, a gas discharge pipe, and a gas communication pipe; the gas input pipe inputs the gas into the processing chamber; the gas discharge pipe discharges the gas out of the processing chamber; and a gas circulation path is formed by the gas communication pipe, the gas input pipe, and the gas discharge pipe.

8. The high-pressure burn-in test apparatus according to claim 7, further comprising a heater, wherein the heater is disposed on the gas input pipe or the gas discharge pipe, and the gas flowing into the processing chamber is heated by the heater.

9. A high-pressure burn-in test apparatus, comprising:
a burn-in furnace comprising a high-pressure burn-in furnace cavity, at least one intake manifold, at least one extension manifold, a communicating tube, and a fan, wherein a processing chamber is formed inside the high-pressure burn-in furnace cavity, one side of the processing chamber is equipped with the at least one intake manifold, the communicating tube is connected to the at least one intake manifold, the periphery of the at least one intake manifold is connected to the at least one extension manifold, the interiors of the at least one intake manifold, the communicating tube and the at least one extension manifold are communicated with each other, at least one test board is provided in the processing chamber, at least one component to be tested is placed on the test board, one end of the extension manifold is equipped with a nozzle, high-pressure gas in the at least one extension manifold is ejected through the at least one nozzle to disturb the gas around the component to be tested, the high-pressure burn-in furnace cavity is equipped with a driving motor, the fan is installed in the processing chamber, and when the driving motor rotates, the fan is driven to rotate so that the gas in the processing chamber generates convection to improve the uniformity of gas temperature distribution;
a circulating device, wherein the gas in the processing chamber is sucked out and a flow rate is adjusted by the circulating device; and
a cooler, wherein the gas flowing into the processing chamber is cooled by the cooler.

10. The high-pressure burn-in test apparatus according to claim 9, wherein the at least one nozzle is disposed on one end of the at least one extension manifold to adjust the ejection direction of the high-pressure gas.

11. The high-pressure burn-in test apparatus according to claim 9, further comprising a pressure varying device, wherein the flow rate of the gas flowing into the processing chamber is adjusted by means of a change in pressure level of the pressure varying device.

12. The high-pressure burn-in test apparatus according to claim 10, further comprising a pressure varying device, wherein the flow rate of the gas flowing into the processing chamber is adjusted by means of a change in pressure level of the pressure varying device.

13. The high-pressure burn-in test apparatus according to claim 9, wherein working pressure in the processing chamber changes in a range from 2 atmospheres (atm) to 50 atmospheres (atm).

14. The high-pressure burn-in test apparatus according to claim 11, wherein working pressure in the pressure varying device changes in a range from 2 atmospheres (atm) to 50 atmospheres (atm).

15. The high-pressure burn-in test apparatus according to claim 9, further comprising a gas conveying unit, wherein the gas conveying unit comprises a gas input pipe, a gas discharge pipe, and a gas communication pipe; the gas input pipe inputs the gas into the processing chamber; the gas discharge pipe discharges the gas out of the processing chamber; and a gas circulation path is formed by the gas communication pipe, the gas input pipe, and the gas discharge pipe.

16. The high-pressure burn-in test apparatus according to claim 15, further comprising a heater, wherein the heater is disposed on the gas input pipe or the gas discharge pipe, and the gas flowing into the processing chamber is heated by the heater.

\* \* \* \* \*